US012027366B2

United States Patent
Min et al.

(10) Patent No.: US 12,027,366 B2
(45) Date of Patent: Jul. 2, 2024

(54) REDUCED HYDROGEN DEPOSITION PROCESSES

(71) Applicant: Applied Materials, Inc., Santa Clara, CA (US)

(72) Inventors: Xiaoquan Min, Cupertino, CA (US); Venkata Sharat Chandra Parimi, Sunnyvale, CA (US); Prashant Kumar Kulshreshtha, San Jose, CA (US); Kwangduk Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 17/095,037

(22) Filed: Nov. 11, 2020

(65) Prior Publication Data

US 2021/0143010 A1    May 13, 2021

Related U.S. Application Data

(60) Provisional application No. 62/934,289, filed on Nov. 12, 2019.

(51) Int. Cl.
 *H01L 21/02*      (2006.01)
(52) U.S. Cl.
 CPC .. *H01L 21/02518* (2013.01); *H01L 21/02642* (2013.01)
(58) Field of Classification Search
 CPC ......... H01L 21/02518; H01L 21/02642; H01L 21/0332; H01L 21/0337; H01L 21/28562;
(Continued)

(56) References Cited

U.S. PATENT DOCUMENTS 8,951,429 B1    2/2015  Liu et al.
2013/0048606 A1*  2/2013  Mao .................... C23F 4/00
                                       216/67
(Continued)

FOREIGN PATENT DOCUMENTS

TW     201736629 A  * 10/2017    ........ H01J 37/32174
TW     2018-10376 A    3/2018
(Continued)

OTHER PUBLICATIONS

Application No. PCT/US2020/059947 , International Preliminary Report on Patentability, dated May 27, 2022, 5 pages.
(Continued)

*Primary Examiner* — Mohammed Shamsuzzaman
(74) *Attorney, Agent, or Firm* — Kilpatrick Townsend & Stockton LLP (57) ABSTRACT

Exemplary methods of semiconductor processing may include treating a surface of a substrate with a hydrogen-containing precursor. The substrate may be disposed within a processing region of a semiconductor processing chamber. The methods may include contacting the substrate with a tungsten-containing precursor. The methods may include forming an initiation layer comprising tungsten on the substrate. The methods may include treating the initiation layer with a hydrogen-containing precursor. The methods may include forming a plasma of the tungsten-containing precursor and a carbon-containing precursor. Hydrogen in the plasma may be limited to hydrogen included in the carbon-containing precursor. The methods may include forming a tungsten-containing hardmask layer on the initiation layer.

20 Claims, 3 Drawing Sheets

(58) Field of Classification Search
CPC ......... H01L 21/76856; H01L 21/76876; C23C 16/0272; C23C 16/0281; C23C 16/30; C23C 16/4404; C23C 16/45523; C23C 16/4586; C23C 16/5096; C23C 16/52; H01J 37/32568; H01J 37/32577; H01J 37/32935; H01J 37/3299

See application file for complete search history.

(56) References Cited

U.S. PATENT DOCUMENTS

| | | | |
|---|---|---|---|
| 2014/0273451 A1* | 9/2014 | Wang | C23C 16/56 |
| | | | 438/675 |
| 2016/0225632 A1* | 8/2016 | Shaikh | C23C 16/52 |
| 2017/0179036 A1 | 6/2017 | Chen et al. | |
| 2017/0207087 A1* | 7/2017 | Roy | H01L 21/0332 |
| 2017/0350013 A1 | 12/2017 | Chan et al. | |
| 2018/0076032 A1 | 3/2018 | Wang et al. | |
| 2022/0163846 A1* | 5/2022 | Yu | G02F 1/133553 |

FOREIGN PATENT DOCUMENTS

| | | | |
|---|---|---|---|
| TW | 2019-21499 A | 6/2019 | |
| TW | 2019-33479 A | 8/2019 | |
| WO | WO-2016003729 A1 * | 1/2016 | .............. B08B 3/08 |
| WO | WO-2019169298 A1 * | 9/2019 | ............ H01J 37/321 |
| WO | WO-2021067632 A2 * | 4/2021 | ............. G03F 7/091 |

OTHER PUBLICATIONS

International Search Report and Written Opinion dated Mar. 4, 2021 in International Patent Application No. PCT/US2020/059947, 6 pages.

* cited by examiner

FIG. 2B

REDUCED HYDROGEN DEPOSITION PROCESSES

CROSS REFERENCES TO RELATED APPLICATIONS

This application claims the benefit of priority to U.S. Patent Application No. 62/934,289 filed Nov. 12, 2019, the contents of which are hereby incorporated by reference in their entirety for all purposes.

TECHNICAL FIELD

The present technology relates to methods and components for semiconductor processing. More specifically, the present technology relates to systems and methods for producing hardmask films.

BACKGROUND

Integrated circuits are made possible by processes which produce intricately patterned material layers on substrate surfaces. Producing patterned material on a substrate requires controlled methods for forming and removing material. As device sizes continue to reduce, aspect ratios of structures may grow, and maintaining dimensions of these structures during removal operations may be challenged. To facilitate patterning of materials on a substrate, hardmasks may be employed. As the number of material layers being patterned is expanding, hardmask selectivity to multiple materials is becoming a greater challenge.

Thus, there is a need for improved systems and methods that can be used to produce high quality devices and structures. These and other needs are addressed by the present technology.

SUMMARY

Exemplary methods of semiconductor processing may include treating a surface of a substrate with a hydrogen-containing precursor. The substrate may be disposed within a processing region of a semiconductor processing chamber. The methods may include contacting the substrate with a tungsten-containing precursor. The methods may include forming an initiation layer comprising tungsten on the substrate. The methods may include treating the initiation layer with a hydrogen-containing precursor. The methods may include forming a plasma of the tungsten-containing precursor and a carbon-containing precursor. Hydrogen in the plasma may be limited to hydrogen included in the carbon-containing precursor. The methods may include forming a tungsten-containing hardmask layer on the initiation layer.

In some embodiments, treating the surface of the substrate may include forming a plasma of the hydrogen-containing precursor, and contacting the surface of the substrate with effluents of the plasma to produce hydrogen terminations. The tungsten-containing precursor may be delivered for the contacting while the treating the surface of the substrate is being performed. A flow rate of the tungsten-containing precursor may be increased while it is being delivered. Treating the initiation layer may include forming a plasma of the hydrogen-containing precursor, and contacting the initiation layer with effluents of the plasma. The plasma may also include a nitrogen-containing precursor. The hydrogen-containing precursor may be or include diatomic hydrogen, and the nitrogen-containing precursor may be or include diatomic nitrogen. The tungsten-containing precursor may be or include tungsten hexafluoride, and the carbon-containing precursor may be or include propene. Diatomic hydrogen may be excluded from the semiconductor processing chamber while forming the plasma of the tungsten-containing precursor and the carbon-containing precursor. The methods may include forming a seasoning layer including a silicon-containing material on exposed surfaces of the processing region of the semiconductor processing chamber.

Some embodiments of the present technology may encompass methods of semiconductor processing. The methods may include forming a seasoning layer on exposed surfaces of a processing region of a semiconductor processing chamber. The methods may include forming an initiation layer including tungsten on a substrate. The substrate may be disposed within the processing region of the semiconductor processing chamber. The methods may include forming a plasma of a tungsten-containing precursor and a carbon-containing precursor. An atomic ratio of hydrogen in precursors delivered to form the plasma to tungsten in precursors delivered to form the plasma may be less than 8:1. The methods may include forming a tungsten-containing hardmask layer on the initiation layer.

In some embodiments, the seasoning layer may be or include silicon oxide and silicon nitride. Forming the initiation layer may include forming a plasma of a hydrogen-containing precursor. Forming the initiation layer may include contacting a surface of the substrate with effluents of the plasma to produce hydrogen terminations. Forming the initiation layer may include flowing a tungsten-containing precursor into the processing region to contact the surface of the substrate. The tungsten-containing precursor may be unexcited while flowed to contact the surface of the substrate. The methods may include forming a plasma of a hydrogen-containing precursor, and contacting the initiation layer with effluents of the plasma. The tungsten-containing precursor may be or include tungsten hexafluoride, and the carbon-containing precursor may be or include propylene. Diatomic hydrogen may be excluded from the semiconductor processing chamber while forming the plasma of the tungsten-containing precursor and the carbon-containing precursor.

Some embodiments of the present technology may encompass methods of semiconductor processing. The methods may include forming a seasoning layer on exposed surfaces of a processing region of a semiconductor processing chamber. The methods may include treating a surface of a substrate with a hydrogen-containing precursor. The substrate may be disposed within the processing region of a semiconductor processing chamber. The methods may include contacting the substrate with a tungsten-containing precursor. The methods may include forming an initiation layer comprising tungsten on the substrate. The methods may include treating the initiation layer with a hydrogen-containing precursor. The methods may include forming a plasma of the tungsten-containing precursor and a carbon-containing precursor. Hydrogen in the plasma may be limited to hydrogen included in the carbon-containing precursor. The methods may include forming a tungsten-containing hardmask layer on the initiation layer.

In some embodiments, the methods may include removing the substrate from the semiconductor processing chamber. The methods may include performing a chamber cleaning process in the processing region of the semiconductor processing chamber. The methods may include forming a plasma of an oxygen-containing precursor within the processing region of the semiconductor processing chamber.

Such technology may provide numerous benefits over conventional systems and techniques. For example, embodiments of the present technology may produce hardmask films characterized by reduced grain sizes. Additionally, the present technology may reduce peeling of formed films. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Hardmask films are utilized for a number of processing operations, which may include forming patterns through multiple layers of different materials. Increasing etch selectivity of these materials relative to the hardmask film affords tighter control of critical dimensions, especially as feature sizes continue to shrink. Amorphous silicon or carbon films are often employed as hardmasks, although selectivity for these films is becoming a greater challenge for more complex memory and logic structures, which may have multiple different films on a substrate, and which may require patterning into high aspect ratio features. Accordingly, newer films may include the incorporation of metal materials within the film to increase etch selectivity. As one non-limiting example, tungsten may be incorporated with a carbon film to increase selectivity relative to a number of oxide and nitride materials. However, as tungsten incorporation within the film is increased, a number of issues may develop.

Tungsten, and other metal-containing materials, may be deposited using metal-halide precursors. In the case of tungsten, tungsten hexafluoride may be used in deposition in a plasma-enhanced chemical vapor deposition process. During the plasma deposition, residual fluorine may be incorporated within the crystalline structure, and may diffuse through the film to the hardmask interface with the substrate. This may reduce adhesion of the film, which may cause undercut during subsequent etching, and may cause film peeling and device failure. To limit adhesion issues, many conventional technologies may utilize hydrogen during the deposition process, which may accept residual fluorine and withdraw it from the chamber as a volatile byproduct.

Incorporating hydrogen into the film may cause additional issues during processing. For example, hydrogen incorporated in the film may be less thermally stable, and during later processing outgassing may occur. Additionally, hydrogen may affect film stress, which may cause the film to become increasingly compressive, which can cause film delamination as well. Finally, volumes of hydrogen within the plasma may affect the deposition process, and may cause increased grain size and crystallinity of the formed tungsten and carbon film. For example, conventional processes may be characterized by grain sizes of 2 nm or more. As critical dimensions reduce to 20 nm or less, these grain sizes may increase surface roughness, and may increase line-edge roughness and line-width roughness during etching operations. Additionally, the larger grain structure may cause an effective twisting during formation of higher aspect ratio features, which may impact subsequent operations by lowering critical dimension uniformity.

To improve grain issues of films, some conventional processes take remedial action. For example, conventional techniques may reduce tungsten incorporation, perform multiple deposition operations, or incorporate boron doping. All of these changes may detrimentally impact processing. For example, as tungsten percentage is reduced, etch selectivity for the film may be reduced as well. Multiple deposition operations may increase queue times, and boron incorporation may reduce the film extinction coefficient.

The present technology overcomes these issues by performing a tungsten deposition that may not utilize additional hydrogen gas during the deposition process. By forming an initiation layer at the substrate surface, the present technology may improve adhesion. When forming the bulk of the hardmask film, by removing hydrogen from the deposition process, a greater number of nucleation sites may form, which may reduce grain size as film growth proceeds. The present technology may also perform chamber cleaning, treatment, and seasoning to further improve deposition and reduce fall-on particles.

Although the remaining disclosure will routinely identify specific deposition processes utilizing the disclosed technology, it will be readily understood that the systems and methods are equally applicable to other deposition, etch, and cleaning chambers, as well as processes as may occur in the described chambers. Accordingly, the technology should not be considered to be so limited as for use with these specific deposition processes or chambers alone. The disclosure will discuss one possible chamber that may be used to perform processes according to embodiments of the present technology before additional variations and adjustments to this system according to embodiments of the present technology are described.

Figure 1:
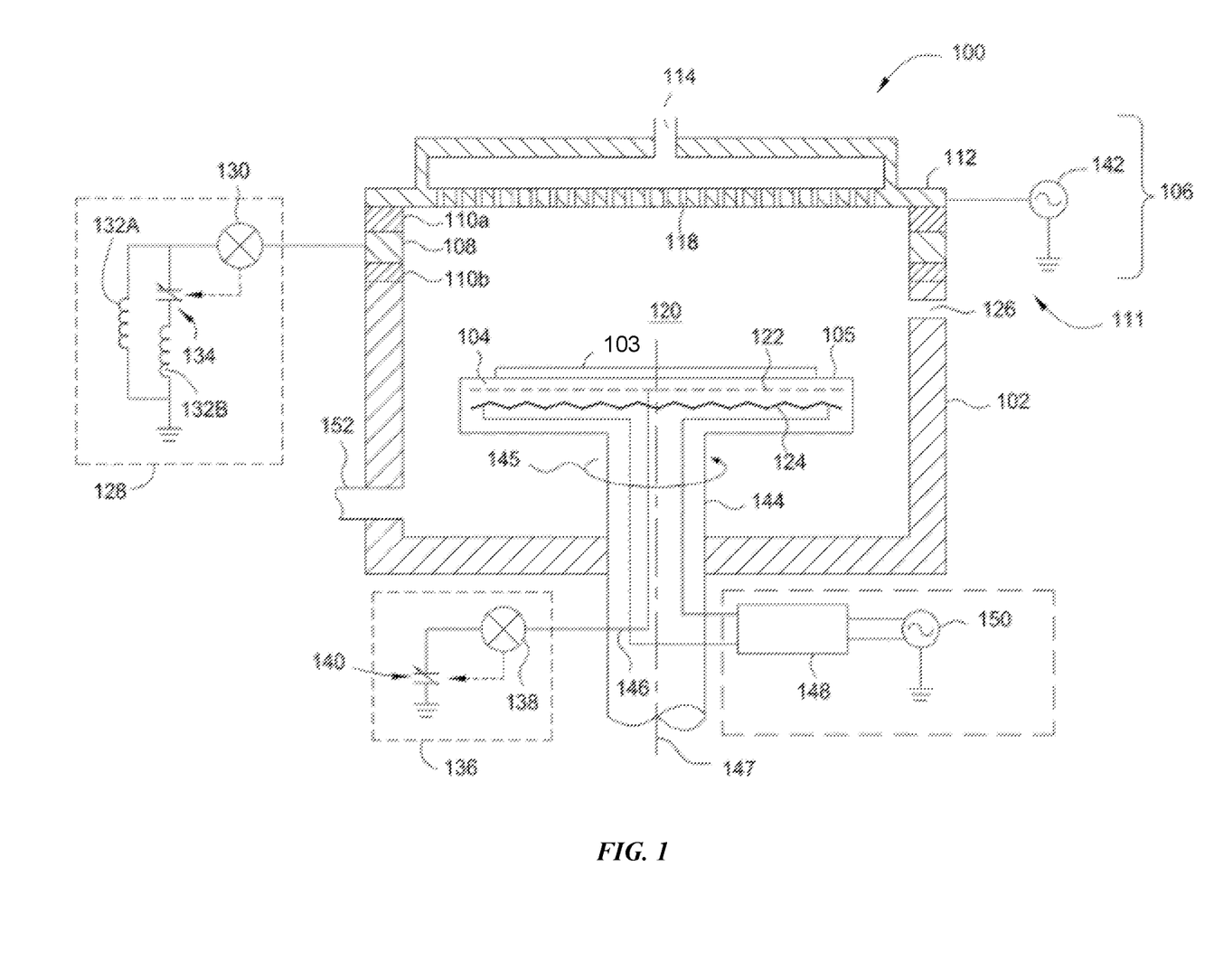
FIG. 1 shows a schematic cross-sectional view of an exemplary plasma system according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2A:
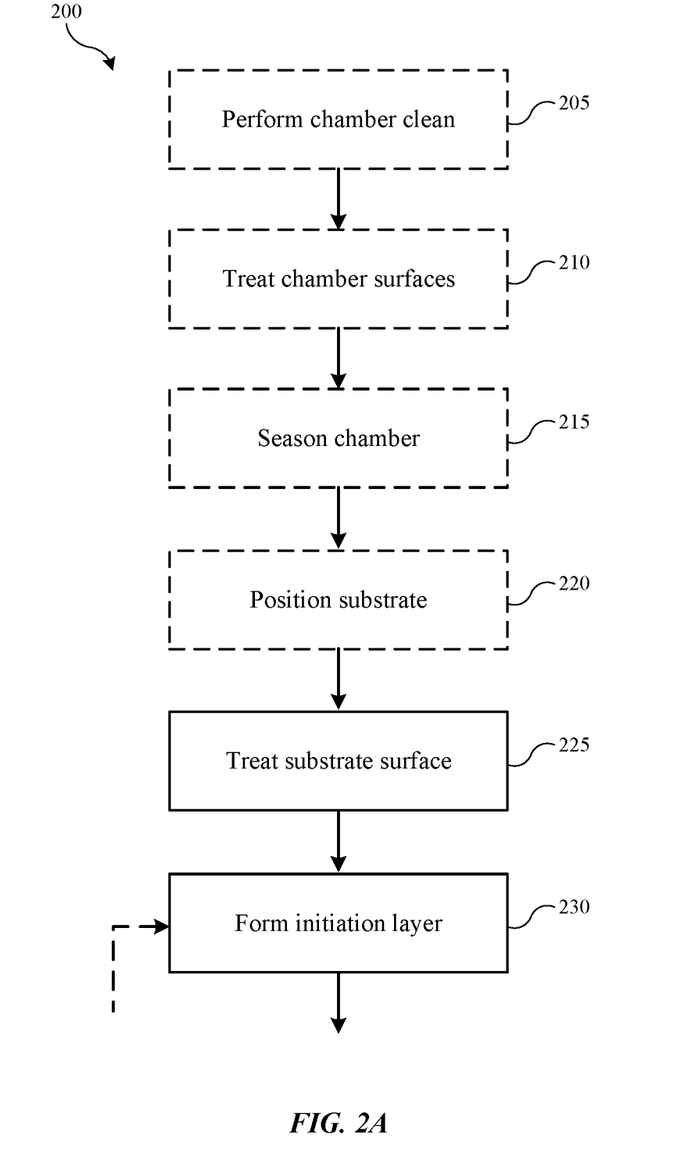
FIG. 2A shows operations in a semiconductor processing method according to some embodiments of the present technology.
Figure 2B:
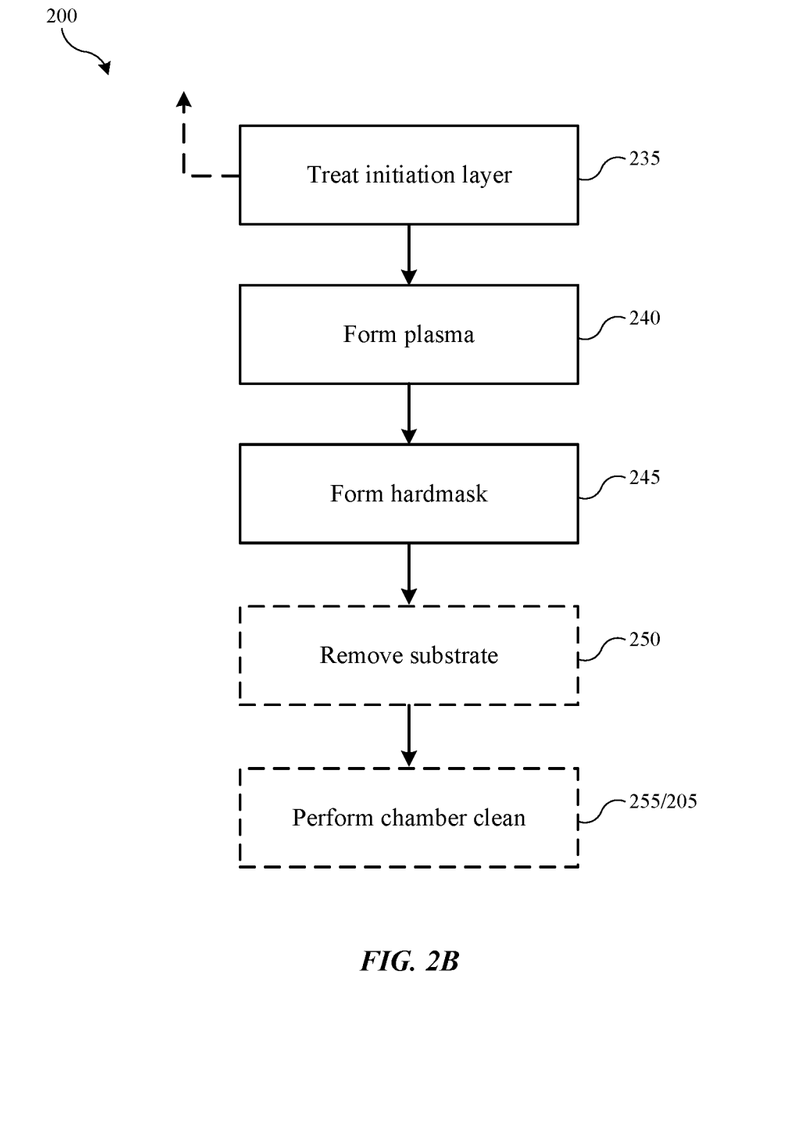
FIG. 2B shows operations in a semiconductor processing method according to some embodiments of the present technology.

FIG. 2 shows exemplary operations in a processing method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include a processing method that may include a number of operations for preparing a chamber for processing, and forming a hardmask film or other deposition operations. The method may include optional operations prior to initiation of method 200, or the method may include additional operations. For example, method 200 may include operations performed in different orders than illustrated. As will be explained, a number of repetitions may be performed and the method may be performed subsequent a previous chamber clean in some embodiments at optional operation 205. Exemplary cleaning operations may utilize plasma enhanced halogen-containing or other etchant precursors. Although beneficial for removing materials, halogen materials may interact with aluminum chamber components as discussed above, and in one non-limiting example, utilizing a fluorine precursor may cause aluminum fluoride to form and/or redeposit about the processing region of the chamber.

In some embodiments, method 200 may include a plasma treatment at optional operation 210, which may include a plasma enhanced precursor, which may be sent from a remote plasma unit or developed in situ in the processing region. The precursor may include a hydrogen-containing precursor, an oxygen-containing precursor, or any other precursor, which may be used or facilitate conversion of aluminum fluoride back into aluminum or aluminum oxide. As one non-limiting example, nitrous oxide, or some other oxygen-containing precursor, such as oxygen, may be delivered to the processing region, and a plasma may be generated. The oxygen-containing plasma effluents formed may convert aluminum fluoride to aluminum oxide, which may more stably remain on the chamber surfaces. Additionally, the precursor may remove aluminum fluoride materials from the chamber.

A seasoning or treatment film may then be developed within the chamber at optional operation 215. For example, an oxide material, such as silicon oxide, may be formed over surfaces of the processing chamber, such as areas within the processing region, including exposed surfaces of processing volume 120 described previously. The region may be an internal plasma region, which may be at least partially defined by a number of chamber components. For example, chamber sidewalls, a showerhead or faceplate, and a pedestal may all be included in or at least partially define aspects of the processing region. A plasma may be formed within the processing region and precursors for depositing silicon oxide may be introduced. The film of silicon oxide may be formed to a first thickness over the chamber surfaces, which may ensure a complete coating of surfaces.

After formation of the silicon oxide surface, method 200 may include forming a nitride material, such as silicon nitride. The silicon nitride may be formed to a second thickness over the silicon oxide. Components within the processing chamber may be or include aluminum. Silicon nitride may not readily deposit or adhere on aluminum surfaces. Silicon nitride may, however, provide a film that may resist etching under processing conditions for which some film depositions may occur. For example, as will be described further below, a tungsten and carbon film may be produced, and the tungsten-containing precursor may include a halogenated tungsten precursor. The in situ plasma may dissociate the precursor forming halogen effluents, which may react with unprotected aluminum. Silicon nitride may trap fluorine, and may provide a better adhesion surface for tungsten and carbon films, which may reduce fall-on particles on the substrate. Silicon oxide may better adhere to aluminum, but may not provide sufficient adhesion for tungsten and carbon films, which may introduce additional fall-on particles to the substrate.

Because the first layer and the second layer provide different benefits, the first layer of silicon oxide may be a different thickness than the second layer of silicon nitride. For example, in some embodiments a role of the silicon oxide may be to provide a full coating across the chamber surfaces. Accordingly, the first thickness may be limited to sufficiently coat the chamber surfaces. The first layer of oxide may therefore be characterized by a first thickness of less than or about 50 nm, and may be characterized by a first thickness of less than or about 40 nm, less than or about 30 nm, less than or about 20 nm, less than or about 10 nm, less than or about 9 nm, less than or about 8 nm, less than or about 7 nm, less than or about 6 nm, less than or about 5 nm, less than or about 4 nm, or less. The first layer may be characterized by a thickness greater than or about 1 nm or more, which may ensure a complete coverage of the interior surfaces. Were gaps to form in the coverage, the silicon nitride may not readily adhere, and aluminum exposure may occur.

In some embodiments, a role of the silicon nitride may be to provide a resistant coating during the plasma processing. Accordingly, the second thickness may be greater than the first thickness in some embodiments, which may afford improved resistance, gettering, and protection with plasma effluents. For example, the second layer of nitride may therefore be characterized by a second thickness of greater than or about 50 nm, and may be characterized by a thickness of greater than or about 60 nm, greater than or about 70 nm, greater than or about 80 nm, greater than or about 90 nm, greater than or about 100 nm, greater than or about 120 nm, greater than or about 140 nm, greater than or about 160 nm, greater than or about 180 nm, greater than or about 200 nm, or more.

Subsequent formation of the coating or seasoning, a substrate may be placed within the processing region at optional operation 220. For example, a substrate support may be coated with the oxide and the nitride during the method, and the substrate may be positioned overlying the first layer and second layer of material on the substrate support. For example, the substrate may be positioned on the silicon nitride material formed over the substrate support. Exemplary substrates may include any number of materials, including silicon, silicon germanium, as well as any number of previously formed films, including oxides, nitrides, or any other materials that may be formed on a semiconductor substrate.

In some embodiments, the substrate may be or include silicon, although additional materials may be used. At operation 225, a surface of the substrate may be treated to facilitate initiation of later deposition operations. Treatment of the substrate surface may be performed with one or more precursors, and may include a hydrogen-containing precursor, a nitrogen-containing precursor, and/or other precursors, for example. A plasma may be formed of the precursors, which may produce hydrogen terminations on the surface of the substrate, which may facilitate incorporation of subsequent materials. The interaction of the hydrogen radicals may create dangling bonds or other ligand terminations at the surface, which may increase interaction with precursors. At operation 230, a tungsten-containing precursor may be delivered to the processing region to contact the substrate. The tungsten-containing precursor, such as tungsten hexafluoride, for example, may be delivered to interact with the dangling bonds at the surface of the substrate. This may form a tungsten layer at the surface of the substrate, which may be less than or about 5 Å in thickness in some embodiments.

In some embodiments the tungsten-containing precursor may have a modulated delivery during the formation. The tungsten-containing precursor may be delivered subsequent termination of the plasma for the treatment, and may be delivered as an unexcited precursor in some embodiments. Additionally, the tungsten-containing precursor may be delivered during or at least partially during the treatment operation in some embodiments. For example, an initial flow rate of the tungsten-containing precursor may be provided during the treatment operation, and may be slowly ramped upward for a period of time, followed by extinguishing the plasma. By slowly ramping the flow rate during the plasma treatment, reduced fluorine radical generation may occur, which may limit the fluorine incorporation in the initiation layer in some embodiments.

At operation 235, a subsequent treatment operation may be performed on the initiation layer. The treatment may include similar or different materials than the treatment performed at operation 225. For example, a hydrogen-containing precursor and/or a nitrogen-containing precursor may be delivered to the substrate processing region, and a plasma may be generated from the precursors. Plasma effluents may contact and/or bombard the tungsten-containing initiation layer. This interaction may incorporate nitrogen within the tungsten material, and may also create nitrogen vacancies from additional bombardment. The produced tungsten and nitrogen layer may operate as a barrier layer for subsequent deposition, and may provide nucleation sites for further deposition.

In some embodiments the initiation layer formation may be repeated along with the treatment for any number of cycles. For example, a tungsten-containing precursor may be flowed again to the processing region to further develop the tungsten and nitrogen layer. Additionally, by repeating the method, fluorine and/or tungsten may be incorporated in vacancies within the structure. This may limit later diffusion of fluorine subsequently delivered during the bulk film formation. After one or more cycles of the development of the initiation layer, method 200 may form a bulk layer of a tungsten and carbon film.

At operation 240, a plasma may be formed of a tungsten-containing precursor and a hydrogen-containing precursor. The tungsten-containing precursor may be or include tungsten-hexafluoride, or any other tungsten-containing material, and the carbon-containing precursor may include a number of carbon-containing precursors. For example, the carbon-containing precursor may be or include any alkane, alkene, or any other carbon-containing material. The precursor may include carbon-and-hydrogen-containing precursors, which may include any amount of carbon and hydrogen bonding. In some embodiments the carbon-containing precursor may consist of carbon-to-carbon and carbon-and-hydrogen bonding.

As noted previously, the bulk film or hardmask may be formed with limited inclusion of hydrogen to facilitate reduction in grain size of the film. Although the carbon-containing precursor may include hydrogen, in some embodiments no additional source of hydrogen may be provided. For example, diatomic hydrogen may be excluded from the precursors delivered. Although inert precursors or carrier gases may be provided with the tungsten-containing precursor and the carbon-containing precursor, no other chemically reactive precursors may be delivered with the precursors in some embodiments. By limiting the hydrogen provided in the plasma to hydrogen included in the carbon-containing precursor, an atomic ratio of hydrogen delivered to form the plasma may be lower than if hydrogen gas were additionally provided. For example, the atomic ratio of hydrogen in the delivered precursors to tungsten may be less than or about 8:1 in embodiments, and may be less than or about 7:1, less than or about 6:1, less than or about 5:1, less than or about 4:1, less than or about 3:1, less than or about 2:1, or less. In one non-limiting example, the carbon-containing precursor may be propene, and the ratio of hydrogen to tungsten may be 6:1 for the precursors delivered to form the plasma. The plasma effluents may deposit on the initiation layer, such as overlying the substrate, and form a hardmask film, which may be or include a carbon-containing or tungsten-containing hardmask film, at operation 245.

Incorporation of additional hydrogen with the delivered plasma-producing precursors may affect properties of the plasma. For example, hydrogen may often be a majority precursor delivered, which may produce a large number of hydrogen radicals within the plasma. While the plasma may at least partially dissociate tungsten-containing precursors, the hydrogen radicals may also increase chemical interaction with the tungsten material, such as be chemically removing fluorine from the precursor. However, the amount of hydrogen may also lower deposition rates due to blocking nucleation sites, and removing materials being deposited.

To improve the reduced chemical interaction by removing the hydrogen delivery, some embodiments of the present technology may increase the amount of tungsten-containing precursor being delivered. For example, maintaining tungsten delivery amounts without provision of hydrogen material may reduce the tungsten incorporation in the film produced, because a reduced amount of tungsten radicals and effluents may deposit or interact at the substrate surface. To increase the amount of tungsten incorporated at the surface, and maintain the tungsten percentage within the film, the tungsten flow rate may be maintained at greater than or about 100 sccm, and may be maintained at greater than or about 150 sccm, greater than or about 200 sccm, greater than or about 250 sccm, greater than or about 300 sccm, or higher. Additionally, in some embodiments the tungsten-containing precursor flow rate may be maintained higher than the carbon-containing precursor in some embodiments, although an atomic flow rate of the carbon-containing precursor may be higher. For example, with exemplary precursors tungsten hexafluoride and propene, the volumetric flow rate ratio of the tungsten-containing precursor to the carbon-containing precursor may be greater than or about 1:1, and may be greater than or about 1.05:1, greater than or about 1.10:1, greater than or about 1.15:1, greater than or about 1.20:1, greater than or about 1.25:1, greater than or about 1.30:1, greater than or about 1.35:1, greater than or about 1.40:1, or higher.

This may maintain a tungsten percentage in the produced film at greater than or about 10%, and may maintain the tungsten percentage in the produced film at greater than or about 12%, greater than or about 13%, greater than or about 14%, greater than or about 15%, greater than or about 16%, greater than or about 17%, greater than or about 18%, greater than or about 19%, greater than or about 20%, greater than or about 21%, greater than or about 22%, greater than or about 23%, greater than or about 24%, greater than or about 25%, greater than or about 26%, greater than or about 27%, greater than or about 28%, greater than or about 29%, or higher. Additionally, by removing delivery of diatomic hydrogen, a deposition rate may be increased for the bulk film. For example, compared to a film formed utilizing diatomic hydrogen with the deposition precursors, the present technology may provide a deposition rate that is greater than or about 1.2 times faster, and may provide a deposition rate that is greater than or about 1.4 times faster, greater than or about 1.6 times faster, greater than or about 1.8 times faster, greater than or about 2.0 times faster, greater than or about 2.2 times faster, greater than or about 2.4 times faster, greater than or about 2.6 times faster, greater than or about 2.8 times faster, or higher.

Reducing the incorporation of hydrogen may provide additional nucleation sites at the substrate for tungsten incorporation. By increasing the number of nucleation positions, the general area of each site may be reduced, which may reduce the area for grain growth for the film. By reducing or removing the hydrogen content within the plasma precursors, the average grain size of formed films may be less than or about 2.5 nm, and in some embodiments may be less than or about 2.4 nm, less than or about 2.3 nm, less than or about 2.2 nm, less than or about 2.1 nm, less than or about 2.0 nm, less than or about 1.9 nm, less than or about 1.8 nm, less than or about 1.7 nm, less than or about 1.6 nm, less than or about 1.5 nm, less than or about 1.4 nm, less than or about 1.3 nm, less than or about 1.2 nm, or smaller. These smaller grain sizes may increase critical dimension uniformity during formation of high aspect ratio features, or features characterized by reduced critical dimensions.

After the deposition process has been completed, such as by forming the bulk film to a desired thickness, the substrate may be removed from the processing region at optional operation 250. Residual carbon material or tungsten and carbon material from the process may have collected on surfaces of the silicon nitride seasoning, or on exposed chamber surfaces. In other processes, alternative precursors may be disposed on the surfaces protected by silicon nitride. Accordingly, in some embodiments a chamber clean may be performed at optional operation 255, which may be similar or identical to the clean performed at operation 205 described previously. For example, performing a chamber clean at optional operation 255, may restart method 200 in some embodiments for an additional substrate. The chamber clean may utilize a halogen-containing precursor, which may be plasma enhanced within the processing region to facilitate removal of residual materials. The cleaning process may remove some or all aspects of the residual tungsten and carbon material, and may remove some or all of each layer of the seasoning material in some embodiments.

The process may then be repeated for a subsequent substrate. In some embodiments the full method may not be repeated. For example, in some processing operations the silicon nitride material may not be fully removed across the processing region, and thus the silicon oxide material may remain intact. Consequently, in some embodiments the method may include forming or reforming or repairing the silicon nitride film, such as by beginning method 200 at some intermediate operation of the process. The method may be initiated with any of the noted operations in some embodiments. By removing diatomic hydrogen and other hydrogen sources from bulk deposition of the films, improved grain structures may be provided over conventional technologies while maintaining or improving optical properties or other film properties. To accommodate fluorine diffusion and other aspects of the films produced, an initiation or barrier layer may be incorporated at an interface of the bulk film and the underlying substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
    treating exposed surfaces of a processing region of a semiconductor processing chamber with a plasma of oxygen-containing precursor;
    forming a seasoning layer on the exposed surfaces of the processing region of the semiconductor processing chamber;
    treating a surface of a substrate with a hydrogen-containing precursor, wherein the substrate is disposed within the processing region of the semiconductor processing chamber;
    contacting the substrate with a tungsten-containing precursor;
    forming an initiation layer comprising tungsten on the substrate;
    treating the initiation layer with a hydrogen-containing precursor;
    forming a plasma of the tungsten-containing precursor and a carbon-containing precursor,
    wherein hydrogen in the plasma of the tungsten-containing precursor and the carbon-containing precursor is limited to hydrogen included in the carbon-containing precursor, and wherein an atomic ratio of hydrogen to tungsten in the tungsten-containing precursor and the carbon-containing precursor is less than 8:1;
    forming a tungsten-containing hardmask layer on the initiation layer, wherein the tungsten-containing hardmask layer is characterized by greater than or about 10% tungsten; and
    removing the substrate from the semiconductor processing chamber.

2. The semiconductor processing method of claim 1, treating the surface of the substrate comprises:
    forming a plasma of the hydrogen-containing precursor, and
    contacting the surface of the substrate with effluents of the plasma to produce hydrogen terminations.

3. The semiconductor processing method of claim 1, wherein the tungsten-containing precursor is delivered for the contacting while the treating the surface of the substrate is being performed.

4. The semiconductor processing method of claim 3, wherein a flow rate of the tungsten-containing precursor is increased while it is being delivered.

5. The semiconductor processing method of claim 1, treating the initiation layer comprises:
    forming a plasma of the second hydrogen-containing precursor, and
    contacting the initiation layer with effluents of the plasma.

6. The semiconductor processing method of claim 5, wherein the plasma further includes a nitrogen-containing precursor.

7. The semiconductor processing method of claim 6, wherein the hydrogen-containing precursor or the second hydrogen-containing precursor comprises diatomic hydrogen, and wherein the nitrogen-containing precursor comprises diatomic nitrogen.

8. The semiconductor processing method of claim 1, wherein the plasma of tungsten-containing precursor comprises tungsten hexafluoride, and the carbon-containing precursor comprises propene.

9. The semiconductor processing method of claim 8, wherein diatomic hydrogen is excluded from the semiconductor processing chamber while forming the plasma of the tungsten-containing precursor and the carbon-containing precursor.

10. The semiconductor processing method of claim 1, further comprising forming the seasoning layer comprising a silicon-containing material on exposed surfaces of the processing region of the semiconductor processing chamber.

11. A semiconductor processing method comprising:
    treating exposed surfaces of a processing region of a semiconductor processing chamber with a plasma of oxygen-containing precursor;
    forming a seasoning layer on the exposed surfaces of the processing region of the semiconductor processing chamber;
    forming an initiation layer comprising tungsten on a substrate, wherein the substrate is disposed within the processing region of the semiconductor processing chamber;
    forming a plasma of a tungsten-containing precursor and a carbon-containing precursor, wherein hydrogen in the plasma of the tungsten-containing precursor and the carbon-containing precursor is limited to hydrogen included in the carbon-containing precursor, and an atomic ratio of hydrogen to tungsten in the tungsten-containing precursor and the carbon-containing precursor is less than 8:1;
    forming a tungsten-containing hardmask layer on the initiation layer; and
    removing the substrate from the semiconductor processing chamber.

12. The semiconductor processing method of claim 11, wherein the seasoning layer comprises silicon oxide and silicon nitride.

13. The semiconductor processing method of claim 11, wherein forming the initiation layer comprises:
    forming a plasma of a hydrogen-containing precursor,
    contacting a surface of the substrate with effluents of the plasma to produce hydrogen terminations, and
    flowing a second tungsten-containing precursor into the processing region to contact the surface of the substrate.

14. The semiconductor processing method of claim 13, wherein the tungsten-containing precursor is unexcited while flowed to contact the surface of the substrate.

15. The semiconductor processing method of claim 11, further comprising:
forming a plasma of a hydrogen-containing precursor,
contacting the initiation layer with effluents of the plasma.

16. The semiconductor processing method of claim 11, wherein the tungsten-containing precursor comprises tungsten hexafluoride, and wherein the carbon-containing precursor comprises propylene.

17. The semiconductor processing method of claim 16, wherein diatomic hydrogen is excluded from the semiconductor processing chamber while forming the plasma of the tungsten-containing precursor and the carbon-containing precursor.

18. A semiconductor processing method comprising:
treating exposed surfaces of a processing region of a semiconductor processing chamber with a plasma of oxygen-containing precursor;
forming a seasoning layer on the exposed surfaces of the processing region of the semiconductor processing chamber;
treating a surface of a substrate with a hydrogen-containing precursor, wherein the substrate is disposed within the processing region of the semiconductor processing chamber;
contacting the substrate with a tungsten-containing precursor;
forming an initiation layer comprising tungsten on the substrate;
treating the initiation layer with a second hydrogen-containing precursor;
forming a plasma of the tungsten-containing precursor and a carbon-containing precursor, wherein hydrogen in the plasma of the tungsten-containing precursor and the carbon-containing precursor is limited to hydrogen included in the carbon-containing precursor, wherein a volumetric flow rate ratio of the tungsten-containing precursor to the carbon-containing precursor is greater than or about 1:1, and wherein an atomic ratio of hydrogen to tungsten in the tungsten-containing precursor and the carbon-containing precursor is less than 8:1;
forming a tungsten-containing hardmask layer on the initiation layer; and
removing the substrate from the semiconductor processing chamber.

19. The semiconductor processing method of claim 18, further comprising:
performing a chamber cleaning process in the processing region of the semiconductor processing chamber after removing the substrate from the semiconductor processing chamber.

20. The semiconductor processing method of claim 19, further comprising forming a plasma of an oxygen-containing precursor within the processing region of the semiconductor processing chamber.

* * * * *